(12) United States Patent
Premutico et al.

(10) Patent No.: US 10,749,123 B2
(45) Date of Patent: Aug. 18, 2020

(54) IMPACT RESISTANT OLED DEVICES

(71) Applicant: Universal Display Corporation, Ewing, NJ (US)

(72) Inventors: Mauro Premutico, Brooklyn, NY (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/661,355

(22) Filed: Mar. 18, 2015

(65) Prior Publication Data
US 2015/0349292 A1 Dec. 3, 2015

Related U.S. Application Data

(60) Provisional application No. 61/970,937, filed on Mar. 27, 2014.

(51) Int. Cl.
*H01L 51/00* (2006.01)
*H01L 51/52* (2006.01)

(52) U.S. Cl.
CPC ........ *H01L 51/0097* (2013.01); *H01L 51/524* (2013.01); *H01L 51/5246* (2013.01); *Y02E 10/549* (2013.01)

(58) Field of Classification Search
None
See application file for complete search history.

(56) References Cited

U.S. PATENT DOCUMENTS

| 4,769,292 A | 9/1988 | Tang et al. |
| 5,247,190 A | 9/1993 | Friend et al. |

(Continued)

FOREIGN PATENT DOCUMENTS

| JP | 2005115362 | 4/2005 |
| JP | 2006260950 | 9/2006 |

(Continued)

OTHER PUBLICATIONS

ArmorCore, UL 752 Specifications and Ammunition. Accessed on Dec. 21, 2018 via the Wayback Machine (Jun. 26, 2011) at https://web.archive.org/web/20110626221047/http://www.armorcore.com/docs/UL_752_Specification.pdf (Year: 2011).*

(Continued)

*Primary Examiner* — Lex H Malsawma
*Assistant Examiner* — Gardner W. S. Swan
(74) *Attorney, Agent, or Firm* — Morris & Kamlay LLP (57) ABSTRACT

A system and method for the fabrication of high efficiency OLED devices and more specifically, the fabrication of OLED panels optically coupled with impact resistant, transparent structures which permit operation of the OLED panel while providing impact resistance. The OLED device can be built directly on an impact resistant transparent structure, or attached to an impact resistant transparent structure after it is built on other types of substrate. The impact resistant transparent structure can be a toughened layer, such as a glass layer, an energy absorption layer, such as Polycarbonate (PC), or a combination of both. The OLED device is configured to transmit light through the impact resistant transparent structure to the viewer, and the impact resistant transparent structure provides impact resistance for the OLED from the force of any impacting object.

18 Claims, 6 Drawing Sheets

(56) References Cited

U.S. PATENT DOCUMENTS

| | | |
|---|---|---|
| 5,368,904 A | 11/1994 | Stephinson et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,548,912 B1 | 4/2003 | Graff et al. |
| 6,952,079 B2 | 10/2005 | Shiang et al. |
| 6,984,934 B2 | 1/2006 | Moeller et al. |
| 7,015,640 B2 | 3/2006 | Schaepkens et al. |
| 7,198,332 B2 | 4/2007 | Kargl et al. |
| 7,279,704 B2 | 10/2007 | Walters et al. |
| 7,431,968 B1 | 10/2008 | Shtein et al. |
| 7,678,423 B2 | 3/2010 | Forrest et al. |
| 7,968,146 B2 | 6/2011 | Wagner et al. |
| 8,125,138 B2 | 2/2012 | Luttgens et al. |
| 8,179,029 B2 | 5/2012 | Boerner et al. |
| 8,277,916 B2 | 10/2012 | Cockman et al. |
| 8,432,095 B2 | 4/2013 | Pang et al. |
| 2003/0230980 A1 | 12/2003 | Forrest et al. |
| 2004/0046497 A1 | 3/2004 | Schaepkens et al. |
| 2004/0174116 A1 | 9/2004 | Lu et al. |
| 2004/0218127 A1 | 11/2004 | Miura |
| 2005/0046341 A1 | 3/2005 | Ikeda et al. |
| 2005/0082966 A1 | 4/2005 | Yamazaki |
| 2005/0191448 A1 | 9/2005 | Suh |
| 2006/0187213 A1* | 8/2006 | Su .................. G06F 3/045 345/173 |
| 2007/0108890 A1 | 5/2007 | Forrest |
| 2007/0159094 A1* | 7/2007 | Oh .................. H01L 27/3223 313/512 |
| 2007/0181872 A1 | 8/2007 | Lee et al. |
| 2007/0252525 A1 | 11/2007 | Seki |
| 2007/0269621 A1 | 11/2007 | Mitsuhashi et al. |
| 2008/0006819 A1 | 1/2008 | McCormick |
| 2008/0129189 A1* | 6/2008 | Cok .................. B82Y 20/00 313/503 |
| 2008/0211402 A1* | 9/2008 | DeCook .............. H01L 51/5237 313/511 |
| 2009/0039773 A1 | 2/2009 | Jun et al. |
| 2009/0267764 A1* | 10/2009 | Klaas .................. G08B 15/007 340/541 |
| 2010/0143785 A1* | 6/2010 | Kwag .................. H01M 2/18 429/156 |
| 2010/0201256 A1 | 8/2010 | Xue et al. |
| 2010/0258821 A1 | 10/2010 | Forrest et al. |
| 2011/0032704 A1* | 2/2011 | Oh .................. G09G 3/14 362/249.14 |
| 2011/0157540 A1* | 6/2011 | Jung .................. G02B 5/305 349/194 |
| 2011/0164047 A1* | 7/2011 | Pance .................. G06F 1/1647 345/581 |
| 2011/0198597 A1 | 8/2011 | Antonenkov et al. |
| 2012/0007791 A1 | 1/2012 | Grbic et al. |
| 2012/0161610 A1 | 6/2012 | Levermore et al. |
| 2012/0181933 A1* | 7/2012 | Ma .................. H01L 27/3281 315/121 |
| 2012/0205698 A1 | 8/2012 | Yamazaki et al. |
| 2013/0153915 A1 | 6/2013 | Choi |
| 2013/0223016 A1* | 8/2013 | Kim .................. G06F 3/044 361/728 |
| 2013/0242399 A1* | 9/2013 | Tsuboi .............. G02F 1/133308 359/609 |
| 2013/0248867 A1 | 9/2013 | Kim et al. |
| 2014/0003072 A1* | 1/2014 | Yamamoto ............ B60Q 1/268 362/503 |
| 2014/0077188 A1 | 3/2014 | Aonuma et al. |
| 2014/0300830 A1* | 10/2014 | Wang .................. G02F 1/1339 349/5 |
| 2014/0346535 A1* | 11/2014 | Son .................. H01L 51/5253 257/88 |
| 2014/0353625 A1 | 12/2014 | Yi et al. |
| 2014/0374704 A1 | 12/2014 | Jang et al. |
| 2015/0034916 A1* | 2/2015 | Lee .................. H01L 51/5253 257/40 |
| 2015/0137097 A1 | 5/2015 | Choi et al. |
| 2015/0200315 A1 | 7/2015 | Mukai et al. |
| 2015/0284989 A1* | 10/2015 | Kim .................. E06B 7/28 49/70 |
| 2016/0121583 A1* | 5/2016 | Edwards .............. H01L 51/524 428/215 |

FOREIGN PATENT DOCUMENTS

| | | |
|---|---|---|
| JP | 2007227288 | 9/2007 |
| JP | 2007234431 | 9/2007 |
| JP | 2010086704 | 4/2010 |
| JP | 2011222246 | 11/2011 |
| JP | 2011222246 A | 11/2011 |
| JP | 201294429 A | 5/2012 |
| JP | 2013198158 | 9/2013 |
| JP | 201565025 | 4/2015 |
| TW | I271697 | 1/2007 |
| TW | I277023 B | 3/2007 |
| WO | 2008057394 | 5/2008 |
| WO | 2010011390 | 1/2010 |
| WO | 2013180544 | 12/2013 |

OTHER PUBLICATIONS

"Mechanical Properties of Tempered Glass", Table of Values; http://www.precisionglass.com/tech/gp.pdf.

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Bulovic, et al., "Weak microcavity effects in organic light-emitting devices", The American Physical Society, Physical Review B, vol. 58, No. 7, Aug. 15, 1998, pp. 3730-3740.

D'Andrade, et al., "Organic light-emitting device luminaire for illumination applications", Applied Physics Letters 88, 192908, 2006, http://dx.doi.org/10.1063/1.2202722, 4 pages.

Gunnarrsson, et al., "Deformation and Failure of Polycarbonate during Impact as a Function of Thickness", Proceedings of the SEM Annual Conference Jun. 1-4, 2009; Albuquerque, New Mexico, USA; 2009 Society for Experimental Mechanics Inc.

Lewis, et al., "Thin-Film Permeation-Barrier Technology for Flexible Organic Light-Emitting Devices", IEEE Journal of Selected Topics in Quantum Electronics, vol. 10, No. 1; Jan./Feb. 2004; pp. 45-57.

Reineke, et al., "White organic light-emitting diodes with fluorescent tube efficiency", Nature, Letters, vol. 459, May 14, 2009, doi:10.1038/nature08003, pp. 234-239.

EESR for EP 15161233.0, dated Oct. 19, 2015.

Chinese Office Action issued in corresponding CN Patent Application No. 104109832, dated Jul. 26, 2018, 12 pages.

JP Notice of Reasons for Rejection for JP 2015-063628, dated Sep. 18, 2018, 16 pages.

CN Office Action for CN201510142861.8 dated May 4, 2018, 7 pages.

Japanese Office Action (with English language translation) for Application No. 2015-063628, dated Jun. 25, 2019, 18 pages.

Taiwanese Office Action (with English language translation) for Application No. 104109832, dated May 28, 2019, 11 pages.

Japanese Office Action (with English language translation) for Application No. JP2015-063628, dated Mar. 24, 2020, 5 pages.

* cited by examiner

IMPACT RESISTANT OLED DEVICES

CROSS-REFERENCE TO RELATED APPLICATIONS

This application claims the benefit under 35 U.S.C. 119(e) of a U.S. provisional patent application of Siddharth Harikrishna Mohan et al., entitled "Hermetically Sealed Isolated OLED Pixels", Ser. No. 61/970,937, filed Mar. 27, 2014, the entire contents of said application being incorporated herein by reference.

FIELD OF THE INVENTION

The present invention relates generally to the fabrication of high efficiency organic light emitting diode (OLED) devices and more specifically, to the fabrication of OLED panels optically coupled with impact resistant, transparent structures which permit operation of the OLED panel while providing impact resistance.

BACKGROUND

In many applications, an electronic device needs to survive extreme external forces. This can range from devices being dropped on the floor, to sustaining impact from various projectiles in harsh environments that may include high speed collisions with sharp, solid debris which are characteristic of combat, high-speed, and catastrophic environments. Special effort has to be paid to the design and construction of electronic devices used in these applications, since construction materials deform under such external forces, and to ensuring continued survival and maintaining functional usage of such devices when placed in such environments.

There are different types of deformations. In "elastic" deformation, materials will return to their original states after the forces are removed. In "plastic" deformation, the change is irreversible. As its name suggests, plastic materials have a wide plastic deformation range. Another category of materials with a large plastic deformation range is ductile metals.

For the most popular display substrate material, e.g., glass, the mechanical failure under high external forces is "Fracture". Glass shatters when a large external force is applied. For example, a ½ pound steel ball dropped from 3 feet generates about 2 Joules of kinetic energy. This generally causes breakage of ¾" thick normal glass plate. This is described as Case A in Table 1 below. Table 1 illustrates four impact cases involving various masses, velocities and kinetic energies.

TABLE 1

|   | mass (gram) | velocity (m/s) | Kinetic energy (J) |
|---|---|---|---|
| A | 227 | 4.23 | 2 |
| B | 227 | 14.67 | 24 |
| C | 104 | 63 | 206 |
| D | 104 | 79.5 | 329 |

To improve the impact resistance, glass can be toughened (i.e., tempered) through thermal and chemical treatment. The basic principle is to introduce compressive stress at the glass surfaces. With the treatment, treated glass becomes much stronger. For example, the toughened glass with the same thickness (e.g., ¾") can withstand the same steel ball dropping from 36 feet with 12 times more kinetic energy, as shown as Case B in Table 1.

To further improve the impact resistance, traditional "bullet" proof glass can be used. However, it is not preferred to use traditional bullet proof glass as display substrate material because of optical effects. Traditional bullet proof glass may include many alternate layers of glass, air pockets, and thermoplastic material. The glass layers closer to the impact surface can easily get damaged. Although this effectively slows down a bullet, it does generate many cracks, which may not be acceptable for optical reasons in certain cases because the densely distributed cracks will make the image not recognizable.

BRIEF SUMMARY

According to embodiments of the disclosed subject matter, a system and method is provided to substantially address the problems associated with the prior art and provide for the fabrication of high efficiency OLED devices and more specifically, to the fabrication of OLED panels optically coupled with impact resistant, transparent structures which permit operation of the OLED panel while providing impact resistance.

Some embodiments of the disclosed subject matter provide a system and method for providing an OLED device on an impact resistant transparent structure, wherein the OLED device can be either a bottom emission or top emission OLED device.

Some embodiments of the disclosed subject matter provide a system and method for providing an OLED device on an impact resistant transparent structure, wherein the impact resistant transparent structure can be a toughened layer, such as a glass layer, an energy absorption layer, such as Polycarbonate (PC), or a combination of both.

Some embodiments of the disclosed subject matter provide a system and method for providing a top emitting OLED on a substrate, and gluing a tempered glass to the device.

Some embodiments of the disclosed subject matter provide a system and method for providing the OLED device with an encapsulation layer.

Accordingly, a system and method is provided for the fabrication of high efficiency OLED devices and more specifically, the fabrication of OLED panels optically coupled with impact resistant, transparent structures which permit operation of the OLED panel while providing impact resistance. The OLED device can be built directly on an impact resistant transparent structure, or attached to an impact resistant transparent structure after it is built on other types of substrate. The impact resistant transparent structure can be a toughened layer, such as a glass layer, an energy absorption layer, such as Polycarbonate (PC), or a combination of both. The OLED device is configured to transmit light through the impact resistant transparent structure depending upon viewer location, and the impact resistant transparent structure provides impact resistance for the OLED from the force of any impacting object.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Examples include Baldo et al., "Highly Efficient Phosphorescent Emission from Organic Electroluminescent Devices," Nature, Vol. 395, 151-154, 1998; ("Baldo-I") and Baldo et al., "Very high-efficiency green organic light-emitting devices based on electro phosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6. More details on OLEDs, and the definitions described above, can be found in U.S. Pat. No. 7,279,704, the entire content of which is incorporated herein by reference.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

Figure 1:
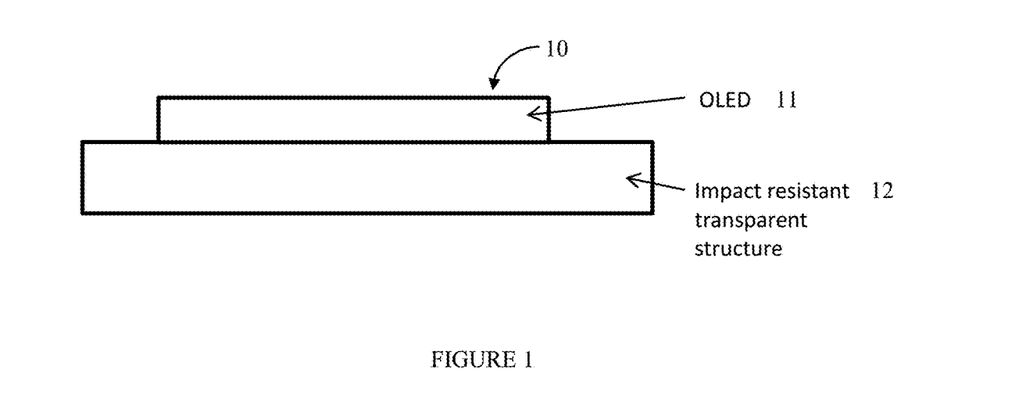
FIG. 1 shows a display with an OLED device on an impact resistant transparent structure according to embodiments of the invention.

In embodiments of the current invention, OLEDs can be optically coupled with impact resistant, transparent structures which permit operation of the OLED panel while providing impact resistance. An OLED device can be optically coupled with an impact resistant transparent structure such as a tempered (or toughened) glass substrate as shown in FIG. 1 through direct contact, adhesion, or other suitable means. The impact resistant transparent structure can be a toughened layer, such as a glass layer, an energy absorption layer, such as Polycarbonate (PC), or a combination of both. FIG. 1 shows a display 10 including an OLED device 11 on an impact resistant transparent structure 12. Accordingly, in the embodiment shown in FIG. 1, when the display 10 is struck by an object, the impact resistant transparent structure 12 can help relieve the impact by providing impact resistance, and thereby protect the structural integrity of the display 10 so that it can continue to function after being subject to the impact. The foregoing structure is especially useful in environments where the impact is likely to occur in one direction of device, such as in the case of the display being located in the interior of a helmet, vehicle or the interior of a body wearable device.

Figure 2:
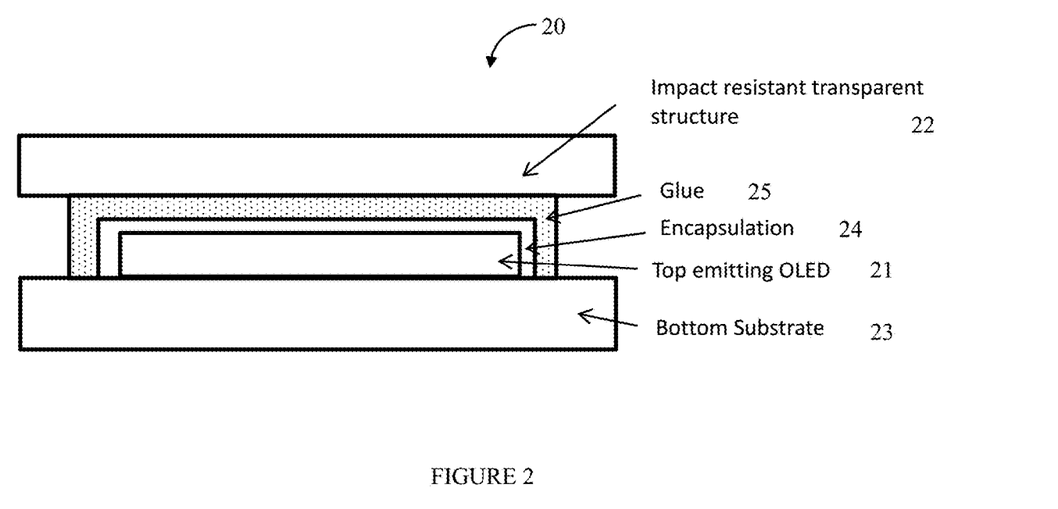
FIG. 2 shows a display with an OLED device attached to an impact resistant transparent structure by glue according to embodiments of the invention.

In an alternative preferred embodiment, the OLED device 11 can be built directly on the impact resistant transparent structure, or attached to the impact resistant transparent structure after it is built on other types of substrate. This includes both bottom emission and top emission OLED devices. For example, after a top emitting OLED is made on a substrate, an impact resistant transparent structure can be glued to the device, as shown in FIG. 2. FIG. 2 shows a display 20 including a top emitting OLED device 21 on a bottom substrate 23 and attached to an impact resistant transparent structure 22 by a substance 25, such an adhesive or glue. The OLED device is covered by an encapsulation layer 24. The bottom substrate 23 can also be comprised of an impact resistant transparent structure, but is not limited thereto. As noted above, the impact resistant transparent structure can be a toughened layer, such as a glass layer, an energy absorption layer, such as Polycarbonate (PC), or a combination of both.

Accordingly, in the embodiment shown in FIG. 2, when the display 20 is struck by an object, the glue layer 25 can help relieve the impact, in addition to the impact resistance provided by the impact resistant transparent structure 22. The foregoing structure may have more desirable application in situations where the OLED device 21 could be subject to impact from multiple directions, such by way of example only, signage or lighting next to a highway, or in harsh combat environments where the OLED device 21 is a shield on a combat vehicle that may be subject to hostile fire from multiple directions.

As known to those skilled in the art, it is important to protect OLEDs from moisture and Oxygen. Tempered glass automatically provides this protection. For example, an OLED can be enclosed by two pieces of tempered glass (i.e., the bottom substrate 23 and impact resistant transparent structure 22). Glue with good barrier properties can be applied at the perimeters of the joined pieces of tempered glass to protect the edges. To improve the overall impact resistance, it is preferred to put supporting structures (not shown) within the area enclosed by the perimeter glue, or use lamination glue everywhere between the two tempered glass pieces, as shown in FIG. 2. For extra protection, the OLED can be thin film encapsulated by the encapsulation layer 24 before the application of the glue and/or cover glass.

The OLED can be a display or a lighting device. For the lighting case, one example is a pendant lighting device with an OLED attached to an impact resistant transparent structure such as tempered glass. The impact resistant structure not only transmits light, but also prevents the device from breaking in the unfortunate event of lighting fixture falling to the ground. Such devices are particularly useful in harsh environments such as athletic fields and sports courts. The inclusion of durable lighting and display devices in close proximity to the athletic event which is protected from shattering and destruction is especially desirable because it enables improved lighting and display elements on and next to the fields of play without endangering the players or requiring constant replacement or impeding the flow of play by tailing during normal play.

Figure 3:
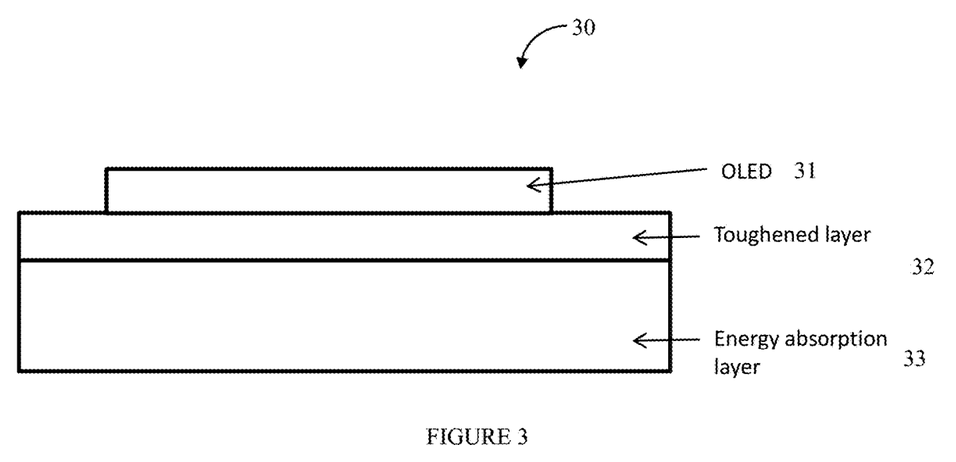
FIG. 3 shows a display with an energy absorption layer placed on top of a toughened layer and an OLED device according to embodiments of the invention.

The provision of the energy absorption layer either separately or in addition to a toughened layer permits operation of the OLED panel while providing further energy absorption. The energy absorption layer can be applied for example, to the outer surface (e.g., impact side) of the toughened layer, such as the glass layer, or preferably, tempered glass layer, as shown in FIG. 3. FIG. 3 shows a display 30 including an OLED device 31 on an impact resistant transparent structure including a toughened layer 32, and an energy absorption layer 33 on an opposite side of the toughened layer 32. The energy absorption layer 33 can be comprised of any suitable materials, such as tempered glass or preferably plastic or alternating layers of both plastic and glass substrates. The specific amount of impact resistance required, as understood by the skilled in the art, will mandate the specific construction of the OLED device and the invention will not intended to be limited to one single configuration of glass, plastic, or combination thereof in the formation of the impact resistance component of the structure.

As a material with wide plastic deformation range, plastic is an excellent candidate for absorbing the energy during the impact. In addition, plastic is transparent, permitting use as a substrate on the light emitting side. Case C in Table 1 captures a study using 3 mm thick Polycarbonate (PC) substrate to stop an exemplary bullet striking the device 30. In the study, the bullet weighs 104 grams and has an entry speed of 63 m/s (e.g., 206 J kinetic energy). There is no penetration of the bullet through the 3 mm substrate. Accordingly, a 3 mm PC substrate together with a (tempered) glass can stop a bullet with up to 200~230 J kinetic energy. At the same time, it is transparent and has excellent barrier properties provided by the glass.

The impact resistance of such an energy absorption layer or PC substrate grows almost linearly with the increase of substrate thickness. For example, a 5.85 mm PC substrate can stop a bullet with 79.5 m/s speed and 329 J kinetic energy, as shown as Case D in Table 1. Accordingly, thicker plastic film can be used for better impact resistance. The two layer system of FIG. 3 is preferred in many cases. In addition, glass does not have to be used. A barrier coated plastic can serve the purpose of both impact resistance and moisture/oxygen resistance.

As noted above, the OLED in this embodiment can also be a display or a lighting device. For the lighting case, one example is a pendant lighting device with an OLED attached to an impact resistant transparent structure including the toughened layer such as tempered glass, and an energy absorption layer or PC substrate. The toughened layer, energy absorption layer and/or PC substrate not only transmits light, but also prevents the device from breaking in the unfortunate event of lighting fixture falling to the ground or being struck by an object such as a ball or other object.

Figure 4:
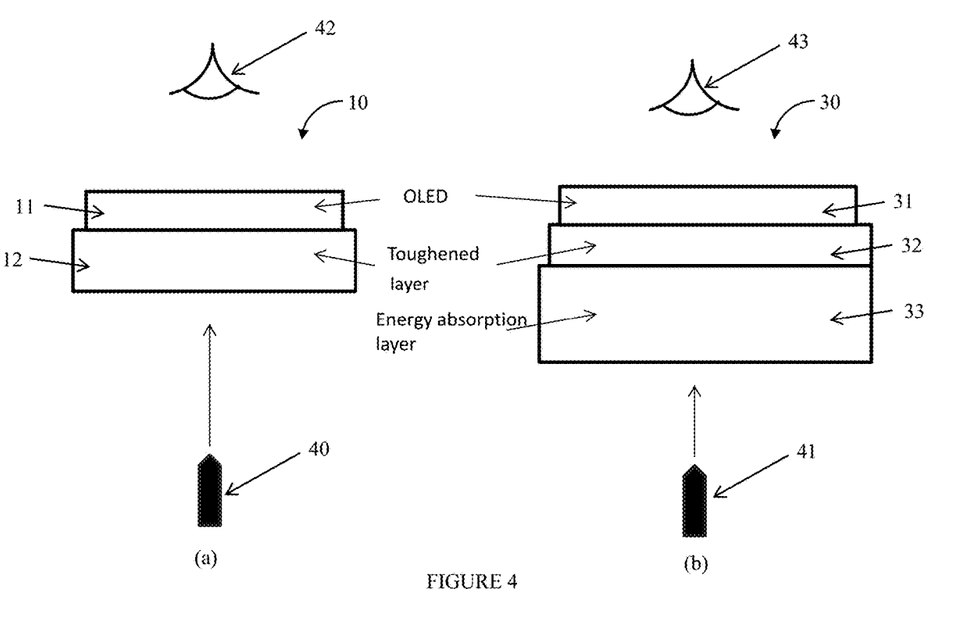
FIG. 4 shows the configuration where viewing and impact are from different sides of the display according to embodiments of the invention.
Figure 5:
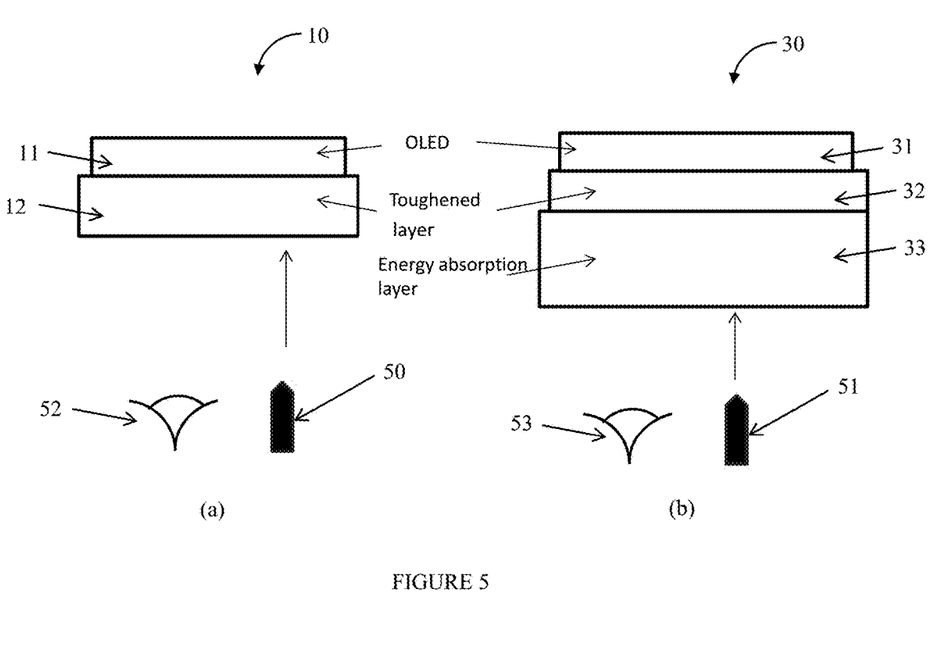
FIG. 5 shows the configuration where viewing and impact are from the same sides of the display according to embodiments of the invention

In each embodiment, various operating conditions can occur. For example, a viewing side and an impact side can be the same side of the display, or can be opposite sides of the display. There are two different configurations for consideration. In the first configuration, the viewing side and impact side are different, as shown in FIG. 4. FIG. 4 shows the operating condition wherein viewing and impact are from different sides of the displays 10 and 30. FIG. 5 shows the operating condition wherein viewing and impact are from the same side of the displays 10 and 30.

In view (a) of FIG. 4, display 10 includes the OLED device 11 optically coupled with the toughened layer of the impact resistant transparent structure 12. Although the OLED device 11 can be configured to transmit light through the impact resistant transparent structure, there is no need to do so in this case. The viewer 42 is on the emitting side of the OLED display, and the impact resistant transparent structure is on an opposite side of the display to provide impact resistance for the OLED 11 from the force of the impacting object 40.

In view (b) of FIG. 4, display 30 includes the OLED device 31 optically coupled with the toughened layer 32 and the energy absorption layer 33 on an opposite side of the toughened layer 32. Although the OLED device 31 can be configured to transmit light through the impact resistant transparent structure, there is no need to do so in this case. The viewer 43 is on the emitting side of the OLED display, and the impact resistant transparent structure is on an opposite side of the display to provide energy absorption and impact resistance for the OLED 31 from the force of the impacting object 41.

In the second configuration, the viewing side and impact side are the same side, as shown in FIG. 5. FIG. 5 shows the operating condition wherein viewing and impact are from the same side of the displays 10 and 30. One example where this may occur is road-side signage displays, which need to be viewed and withstand storms, rocks and high speed projectiles which may behave similar to bullets. In this case, it is preferred to use the tempered glass and energy absorbing materials on the light emitting side. Since the non-emitting side can be made not visible to the external viewers, opaque materials can be used. Electronics can be placed either behind the device or in the bases/frames with good protection.

In view (a) of FIG. 5, display 10 includes the OLED device 11 optically coupled with the toughened layer of the impact resistant transparent structure 12. The OLED device 11 is configured to transmit light through the impact resistant transparent structure to the viewer 52 and the impact resistant transparent structure provides impact resistance for the OLED 11 from the force of the impacting object 50 on the same side as the viewer 52.

In view (b) of FIG. 5, display 30 includes the OLED device 31 optically coupled with the toughened layer 32 and the energy absorption layer 33 on an opposite side of the toughened layer 32. The OLED device 31 is configured to transmit light through the impact resistant transparent structure to the viewer 53 and the impact resistant transparent structure provides impact resistance for the OLED 31 from the force of the impacting object 51 on the same side as the viewer 53.

When the potential impact is strong, the thickness of the energy absorbing layer can be increased. However, continuously increasing the plastic thickness may not be desirable because the overall device becomes bulkier and heavier, and the transparency of the substrate becomes less and less. For the case of really high-impact, high-local pressure, such as a high speed incoming projectile, another approach can be used according to embodiments of the invention. Rather than stopping a projectile, such as a bullet, the device will let the projectile pass through the display. An opaque structure can be used behind the display to totally stop the impact. Although there is local damage, the rest of the device will be intact. To do so, a thin layer of material with wide plastic deformation range can be used.

Figure 6:
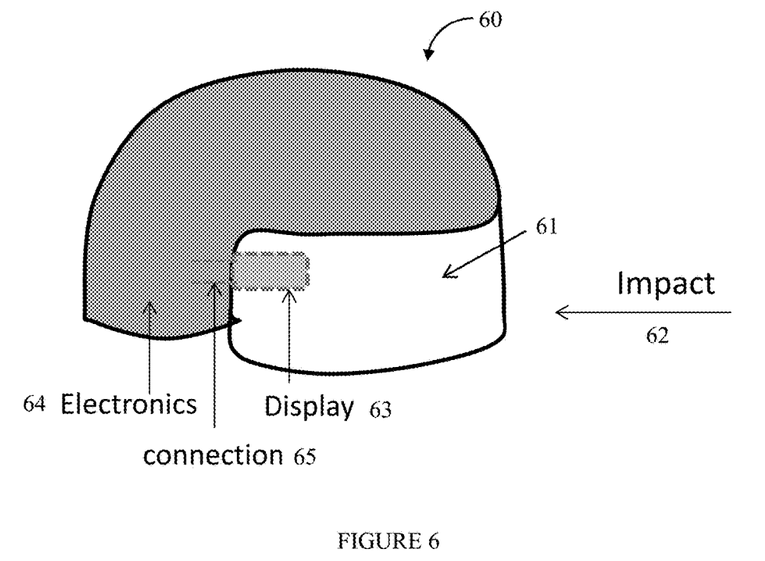
FIG. 6 shows a helmet with a transparent face shield and display according to embodiments of the invention.

FIG. 6 shows a helmet 60 with a transparent face shield 61 and display 63. The face shield 61 provides protection from external mechanical impact, illustrated by the arrow 62. At the same time, there can be a display 63 on the inside surface of the face shield 61 coupled with associated electronics 64 via wired or wireless connection 65. The display 63 ideally should not obstruct the view through the face shield 61.

The helmet 60 of FIG. 6 illustrates an application of the arrangement of view (a) of FIG. 4. The viewer is on the emitting side of the OLED display 63, and the impact resistant transparent structure, the transparent face shield 61, is on an opposite side of the display 63 to provide impact resistance for the OLED from the force of the impacting object of arrow 62. An energy absorption layer can also be added over the face shield 61, illustrating an arrangement of view (b) of FIG. 4.

Figure 7:
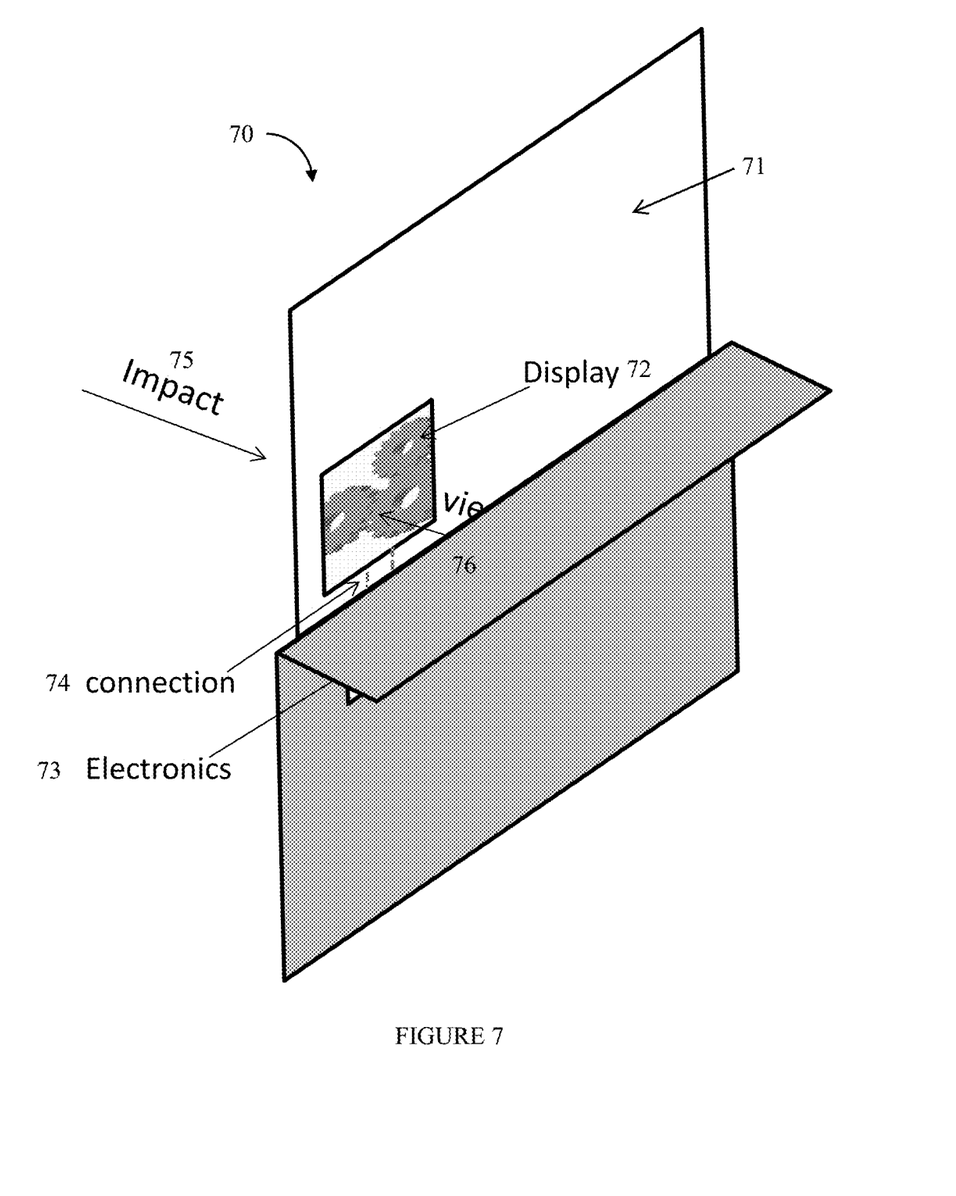
FIG. 7 shows a security check station window and display according to embodiments of the invention.

FIG. 7 shows a security check station 70, such as document check points at airports, courthouses and other secured locations. The security check station 70 includes at least a window 71, display 72 on the inside surface of the window 71 coupled with associated electronics 73 via wired or wireless connection 74. The display 72 ideally should not obstruct the view through the window 71. Further, the window 71 needs to withstand mechanical impact from at least one side, illustrated by the arrow 75. It is beneficial to have the display 72 on the other side to display appropriate information when viewed, illustrated by the arrow 76.

The security check station 70 of FIG. 7 illustrates another application of the arrangement of view (a) of FIG. 4. The viewer is on the emitting side of the OLED display 72, and the impact resistant transparent structure, the window 71, is on an opposite side of the display 72 to provide impact resistance for the OLED from the force of the impacting object of arrow 76. An energy absorption layer can also be added over the window 71, illustrating an arrangement of view (b) of FIG. 4.

Figure 8:
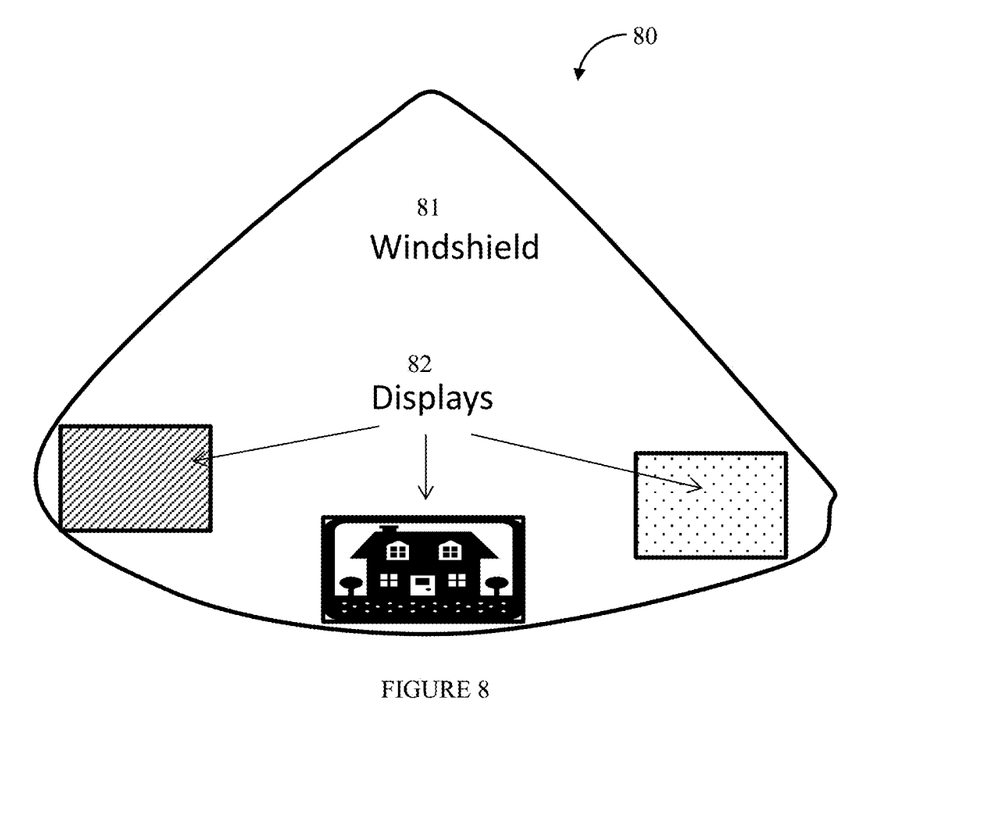
FIG. 8 shows an airplane cockpit windshield and displays according to embodiments of the invention.

FIG. 8 shows an airplane cockpit window 80 with displays on the windshield. The airplane cockpit window 80 includes at least a windshield 81, displays 82 on the inside surface of the windshield 81 coupled with associated electronics via wired or wireless connection. The displays 82 ideally should not obstruct the view through the windshield 81. Further, the windshield 81 needs to withstand mechanical impact from at least one side. It is beneficial to have the display 82 on the other side to display appropriate information when viewed.

Again, the airplane cockpit window 80 of FIG. 8 illustrates another application of the arrangement of view (a) of FIG. 4. The viewer is on the emitting side of the OLED displays 82, and the impact resistant transparent structure, the windshield 81, is on an opposite side of the displays 82 to provide impact resistance for the OLED from the force of impacting objects. An energy absorption layer can also be added over the windshield 81, illustrating an arrangement of view (b) of FIG. 4.

In the above examples, the display viewer is positioned on the opposite side from the side where the impact is most likely to occur (e.g., impact side). The energy absorption layer and toughened glass need to be placed on the impact side. The display needs to emit light from the viewing side. Although a conventional display can be used, it blocks the view of the impact side from the viewer. This is not desired since the viewer would prefer to monitor the situation through the display. In other words, it is preferred that the viewer can see the display image and the scene behind the display.

One type of display that can meet this requirement is a transparent OLED display with semi-transparent pixels. The display image is visible from both sides, which may not be desirable in some applications. Another approach is to use a display that integrates passive transparent regions at the pixel level. The display pixels only emit light in one direction, but transparent regions are provided next to the display pixels to let light through. This display can be built on or attached to toughened glass with or without energy absorption materials. The emitted light will not go through the impact resistant material (e.g., toughened glass and energy absorption layer).

It is important to also protect driving electronics from the external impact. One approach is to place the electronics inside more robust structures. In the helmet case, the electronics can be hidden inside the helmet, not on the face shield, as shown in FIG. 6. In the security window application, the electronics can be placed in the base of the window, as shown in FIG. 7.

In these or other cases, means are needed to protect the device from moisture and oxygen attack from the damaged region. One way to realize this is to divide an OLED into a plurality of smaller segmented pixel regions. Preferably, each pixel segment region has a fuse, such as that described in U.S. Patent Publication No. 2012/0181933, the entire content of which is incorporated herein by reference. With the fuse, any local defects can only cause local damage and the rest of the device still survives.

The smaller pixels within the OLED can also be individually hermetically sealed, as disclosed in concurrently filed U.S. patent application Ser. No. 14/661,335, entitled "Hermetically Sealed Isolated OLED Pixels", U.S. Application Publication No. 2015/0280170, the entire content of which is incorporated herein by reference.

In preferred embodiments of the current invention, the OLED panel consists of a plurality of OLED pixels; each OLED pixel is individually hermetically sealed and isolated from its neighboring pixels. More specifically, the organic stack of the OLED pixel is contained within its own hermetically sealed structure. Hermetic sealing is achieved by making the structure on a barrier coated substrate and using a first barrier material as the grid and a second barrier for encapsulating the entire OLED pixel. The first barrier material provides the edge seal while the second barrier disposed over the pixel provides adequate protection from top down moisture diffusion. By isolating and hermetically sealing individual pixels; any damage such as moisture and oxygen ingress due to defects or particles, delamination, cracking etc. can be effectively contained within the pixel thereby protecting the other pixels in the panel. Such structure is especially desirable in harsh environments in which selecting damage control of a system is most desired so as to maintain partial functional operation even after a partial destruction of the device.

With the integration of fuse and hermetically sealed pixels, embodiments of the present displays and OLED devices can survive projectile penetration which completely destroys a physical area in the OLED device. When the bullet pierces through the device, the fuse will protect the device from shorting; the individually hermetically sealed pixels or pixel regions will prevent moisture/Oxygen from damaging the device through the damaged region.

In some cases, it is important to provide redundancy in driving electronics, especially at the display pixel level, such that the undamaged portion of a display can continue function for some relevant period of time.

In a further embodiment of the present invention, the OLED display is integrated into the laminated transparent protective structure, which may include a plurality of plastic such as polycarbonate, glass or solid resinous materials. The OLED display including the entirety of the OLED stack and associated drive electronics, is protectively encased in the laminated structure and segmented to avoid catastrophic malfunction in the event of impact with a projectile damages a portion of the structure. The damaged pixel segments can be protected and effectively isolated as described above by creating pixel segments which selectively degrade without degrading the majority of pixel segments that were not directly damaged.

With respect to the electronics, the system can be provided with adaptive electronic drivers and components that sense short circuit and overdrive conditions and selectively stop driving the damaged portion of the display area that is incorporated in the damaged pixel segment region and on the driver lines affected by the short and or overdrive conditions. Based on such feedback the display can configure itself to use the functional portions of the display only and to present the most critical data in the functional portions of the screen. Although the base drive electronics may be integrated in the OLED display device embedded in the laminated structure, it is assumed the display drive electronics may be outside the physical laminated area.

Devices fabricated in accordance with embodiments of the invention may be incorporated into a wide variety of consumer products, including flat panel displays, lighting devices, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20° C. to 25° C.), but could be used outside this temperature range, for example, from −40° C. to +80° C. As previously noted, the nature of devices made using the present invention can also be particularly useful in security, first responder and sports applications. For example, devices of the present invention could be utilized as security walls in a secure entry station, or as installed components of an athletic field, such as a hockey rink or a separator at a football stadium that include informational display signage.

The materials and structures described herein may have applications in devices other than OLEDs. For example, other optoelectronic devices such as organic solar cells and organic photo detectors may employ the materials and structures. More generally, organic devices, such as organic transistors, may employ the materials and structures.

It is to be appreciated that the Detailed Description section, and not the Summary and Abstract sections, is intended to be used to interpret the claims. The Summary and Abstract sections may set forth one or more but not all illustrative embodiments of the present invention as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not limitation, such that the terminology or phraseology of the present specification is to be interpreted by the skilled artisan in light of the teachings and guidance.

We claim:

1. A display device, comprising:
   an organic light emitting diode (OLED) device optically coupled to and directly disposed on an impact resistant transparent structure,
   wherein the OLED device comprises a plurality of pixel segment regions, each pixel segment region having a separate fuse that prevents shorting when the each pixel segment region is damaged;
   wherein the OLED device is configured to transmit light through the impact resistant transparent structure, and the impact resistant transparent structure is configured to provide impact resistance for the OLED device, and
   wherein the impact resistant transparent structure comprises: a toughened material layer comprising one or more layers of a tempered glass material, and an energy absorption material layer comprising a Polycarbonate (PC) material layer at least 3 mm thick, and
   wherein the OLED device is disposed over a first side of the toughened material layer and the energy absorption material layer is disposed only over a second side of the toughened material layer that is distinct from the first side.

2. The device of claim 1, further comprising an opaque material layer which selectively inhibits light transmission from the OLED device in at least one direction of the device.

3. The device of claim 1, wherein the impact resistant transparent structure is secured to the OLED device using a glue layer, wherein the glue layer is configured to provide further impact resistance for the OLED device.

4. The device of claim 1, further comprising a barrier element, disposed over the impact resistant transparent structure and forming an insulating grid surrounding the OLED device, wherein the barrier element provides an edge seal for each pixel segment region.

5. The device of claim 4, wherein each respective pixel comprises a stack having a cathode layer, an organic layer and an anode layer, wherein at least the organic layer of each stack is patterned and surrounded by the barrier element to isolate it from an organic layer of adjacent stacks.

6. The device of claim 1, wherein the device is flexible.

7. The device of claim 1, wherein driving circuitry for the OLED device is disposed in a location separate from and outside of a physical area of the display device.

8. The display device of claim 1, wherein the OLED device comprises components configured to sense short circuit and/or overdrive conditions.

9. The device of claim 1, wherein driving circuitry for the OLED is disposed in a housing that holds the impact resistant transparent structure.

10. The device of claim 9, wherein the impact resistant transparent structure is incorporated into a windshield, an exterior window of a vehicle, or a helmet visor.

11. The device of claim 1, wherein the energy absorption material layer comprises a material capable of absorbing at least 200 J of kinetic energy without breaking.

12. A display device, comprising:
an organic light emitting diode (OLED) device optically coupled to and directly disposed on an impact resistant transparent structure,
wherein the OLED device comprises a plurality of pixel segment regions, each pixel segment region having a separate fuse that prevents shorting when the each pixel segment region is damaged;
wherein the OLED device is configured to transmit light through the impact resistant transparent structure, and the impact resistant transparent structure is configured to provide impact resistance for the OLED device, and
wherein the impact resistant transparent structure comprises:
a toughened material layer separate from driving circuitry of the OLED device and comprising one or more layers of a tempered glass material; and
an energy absorption material layer separate from driving circuitry of the OLED device and formed of a Polycarbonate (PC) material at least 3 mm thick; and
wherein the OLED device is disposed over a first side of the toughened material layer and the energy absorption material layer is disposed over a second side of the toughened material layer that is distinct from the first side.

13. The display device of claim 12, wherein the OLED device comprises the driving circuitry.

14. A method of fabricating an organic light emitting diode (OLED) device display, comprising:
forming an impact resistant transparent structure; and
forming an OLED device to be disposed over the impact resistant transparent structure, wherein the OLED device is optically coupled to and directly disposed on the impact resistant transparent structure and is configured to emit light through the impact resistant transparent structure, and the impact resistant transparent structure is configured to provide impact resistance for the OLED device,
wherein the OLED device comprises a plurality of pixel segment regions, each pixel segment region having a separate fuse that prevents shorting when the each pixel segment region is damaged;
wherein forming the impact resistant transparent structure comprises:
forming a toughened material layer comprising one or more layers of a tempered glass material, and
forming an energy absorption material layer comprising a Polycarbonate (PC) material layer at least 3 mm thick;
wherein the OLED device is disposed over a first side of the toughened material layer and the energy absorption material layer is disposed only over a second side of the toughened material layer that is distinct from the first side.

15. The method of claim 14, further comprising forming an opaque material layer which selectively inhibits light transmission from the OLED device in at least one direction of the device.

16. The method of claim 14, further comprising securing the impact resistant transparent structure to the OLED device using a glue layer, wherein the glue layer is configured to provide further impact resistance for the OLED device.

17. The method of claim 14, further comprising:
forming and patterning a barrier element over the impact resistant transparent structure to provide an insulating grid surrounding the OLED device, wherein the barrier element provides an edge seal for each pixel segment region,
wherein forming the OLED device comprises forming a stack having a first cathode layer, an organic layer and an anode layer, and wherein each stack is patterned and surrounded by the barrier element to isolate the organic layer of the respective pixel from an organic layer of adjacent stacks.

18. The method of claim 14, wherein the OLED device comprises components configured to sense short circuit and/or overdrive conditions.

* * * * *